United States Patent [19]
Kimura et al.

[11] Patent Number: 5,323,043
[45] Date of Patent: Jun. 21, 1994

[54] CMOS INTEGRATED CIRCUIT

[75] Inventors: Madoka Kimura; Yoshio Miyazaki, both of Tokyo, Japan

[73] Assignee: NEC Corporation, Tokyo, Japan

[21] Appl. No.: 3,561

[22] Filed: Jan. 13, 1993

[30] Foreign Application Priority Data

Jan. 17, 1992 [JP] Japan ................................. 4-006782

[51] Int. Cl.$^5$ ............................................. H01L 27/02
[52] U.S. Cl. .................... 257/371; 257/372; 257/375
[58] Field of Search ......................... 257/371, 375, 372

[56] References Cited

U.S. PATENT DOCUMENTS 4,907,058 3/1990 Sakai ..................... 257/371
5,146,112 9/1992 Ito et al. ................. 257/371

OTHER PUBLICATIONS

"A Bonded-SOI-Wafer CMOS 16-Bit 50-KSPS Delta-Sigma ADC", T. Takaramoto et al., IEEE 1991 Custom Integrated Circuits Conference, pp. 18.1.1–18.1.4.

Primary Examiner—Edward Wojciechowicz
Attorney, Agent, or Firm—Burns, Doane, Swecker & Mathis

[57] ABSTRACT

A first shallow well 5, a second shallow well 3, a third deep well 4, a fourth shallow well 5' and a fifth shallow well 2 are formed on an electroconductive substrate 1, in which a first and second digital series power supplies DVDD, DVSS are each connected to the first shallow well 5 completely included by the third deep well 4 and the second shallow well 3 partially included by the third deep well 4 respectively, a first and second analog series power supplies AVDD, AVSS are each connected to the fourth and fifth shallow wells 5', 2 not included by the third deep well 4 respectively, a MOS transistor constituting a digital circuit is formed on the surface of the first and second shallow wells 5, 3 to which the digital series power supply is connected and a MOS transistor constituting an analog circuit is formed on the surface of the fourth and fifth shallow wells 5', 2 to which the analog series power supply is connected. As a result, it can be effectively prevented at a low cost for the digital noise of the CMOS integrated circuit mixedly loading the analog and digital circuits from being backfired to the analog circuit.

4 Claims, 2 Drawing Sheets 5,323,043

CMOS INTEGRATED CIRCUIT

FIELD OF THE INVENTION

The present invention relates to a CMOS integrated circuit, for example, an LSI on which analog circuits and digital circuits are commonly placed and, in particular, to a CMOS integrated circuit of an arrangement which may prevent the digital noise from being fed back into to the analog circuit.

BACKGROUND OF THE INVENTION

Conventionally, there has been a method of utilizing an SOI (Silicon On Insulator) as a most effective means for preventing the digital noise from being fed back into to the analog circuit in a CMOS integrated circuit on which both analog and digital circuits appear. For the SOI, its operational effectiveness is shown in, for example, "A Bonded-SOI-Wafer CMOS 16-bit 50 ksps Delta-Sigma ADC", IEEE 1991, Custom Integrated Circuits Conf. 18. 1.

FIG. 1 illustrates a cross-sectional view of a CMOS integrated circuit using such an SOI arrangement, in which reference numeral 47 denotes a silicon substrate, 48 and 50 each an n-substrate, 49, 51 a p-well formed within the n-substrate, 52 $SiO_2$, 53, 59 a contact of the n-substrate, 54, 55, 60, 61 a source/drain of a p-channel transistor, 56, 57, 62, 63 a source/drain of an n-channel transistor, 58, 64 a contact of the p-well, 65 through 68 a gate polysilicon, DVDD a digital positive power supply, DVSS a digital negative power supply, AVDD an analog positive power supply and AVSS an analog negative power supply.

If such an SOI arrangement is adopted, since an area constituting the analog circuit (the area comprising the n-substrate 48 and the p-well 49 in FIG. 1) and an area constituting the digital circuit (the area comprising the n-substrate 50 and the p-well 51 of FIG. 1) can be separated with $SiO_2$ 52, the noise feedback from the digital to the analog circuit can be reduced.

However, with the foregoing conventional CMOS integrated circuit using the SOI arrangement, its manufacturing process, which requires bonding and grinding, is complicated, so that it takes much time to manufacture while its manufacturing cost is high.

SUMMARY OF THE INVENTION

Accordingly, an object of the present invention is to realize a CMOS integrated circuit which may prevent the digital noise from being fed back into to the analog circuit without using a complicated processes.

According to the present invention, in order to achieve the foregoing end, there is provided a CMOS integrated circuit comprising:

a first and second wells each with different electrically conductive type, which are each formed on an electrically conductive substrate;

a third well of the same electrically conductive type as that of the second well, which includes the first well and part of the second well;

a first and second digital series power supplies each for imparting a different potential, the first and second digital series power supplies being each connected to the first and second wells;

a fourth and fifth wells each with a different electrically conductive type, which are each formed on the electrically conductive substrate, remote from the third well;

a first and second analog series power supplies for imparting a different potential, the first and second analog series power supplies being each connected to the fourth and fifth wells;

a p- and n-channel MOS transistors each formed on the surface of the first and second wells, the MOS transistors constituting a digital CMOS circuit; and a p- and n-channel MOS transistors each formed on the surface of the fourth and fifth wells, the MOS transistors constituting an analog CMOS circuit.

Here, among the foregoing first and second digital series power supplies, one imparting a high potential is connected to one of the first and second wells in which the p-channel MOS transistor is formed, and the other imparting a low potential is connected to the other of the first and second wells in which the n-channel MOS transistor is formed. Among the first and second analog series power supplies, one imparting a high potential is connected to one of the fourth and fifth wells in which the p-channel MOS transistor is formed, and the other imparting a low potential is connected to the other in which the n-channel MOS transistor is formed.

The fourth and fifth wells can be made substantially the same as the first and second wells, respectively.

In other words, the present invention provides a CMOS integrated circuit which comprises a first shallow electroconductive island diffusion area, a second shallow electroconductive island diffusion area and a third deep electroconductive island diffusion area, a first and second digital series power supplies being each connected to the first shallow electroconductive island diffusion area (first well) completely included by the third deep electroconductive island diffusion area (third well) and the second shallow electroconductive island diffusion area (second well) partially included by the third deep electroconductive island diffusion area (third well), a first and second analog series power supplies being each connected to the first and second shallow electroconductive island diffusion areas (fourth and fifth wells) not included by the third deep electroconductive island diffusion area (third well), a MOS transistor constituting a digital circuit being formed on the surface of the first and second shallow electroconductive island diffusion areas (first and second wells) to which the foregoing digital series power supplies are each connected, a MOS transistor constituting an analog circuit being formed on the surface of the first and second shallow electroconductive island diffusion area (fourth and fifth wells) to which the foregoing analog series power supplies are each connected.

That is, the CMOS integrated circuit according to the present invention comprises the first (shallow), second (shallow), third (deep), fourth (shallow), and fifth (shallow) wells which are each formed on the electroconductive substrate, the first and second digital series power supplies are each connected to the first shallow well completely included by the third deep well and the second shallow well partially included by the third deep well, the first and second analog series power supplies are each connected to the fourth and fifth shallow wells not included by the third deep well, the MOS transistor constituting the digital circuit is formed on the surface of the first and second shallow wells to which the foregoing digital series power supplies are each connected, and the MOS transistor constituting the analog circuit is formed on the surface of the fourth and fifth shallow wells to which the analog series power supplies are each connected.

According to the present invention, the area constituting the digital circuit is separated from the substrate by a depletion layer formed by imparting the potential of the deep well by the digital series power supply. As a result, it can be prevented the noise from being fed back from the digital portion to the analog portion. Since the CMOS integrated circuit according to the present invention can be achieved by merely adding a deep well forming process to the normal process of manufacturing the CMOS integrated circuit, it does not take long time to manufacture and the cost can be considerably reduced.

DETAILED DESCRIPTION OF THE PREFERRED EMBODIMENTS

Specific embodiments of the present invention are hereinafter described with reference to the accompanying drawings.

Figure 1:
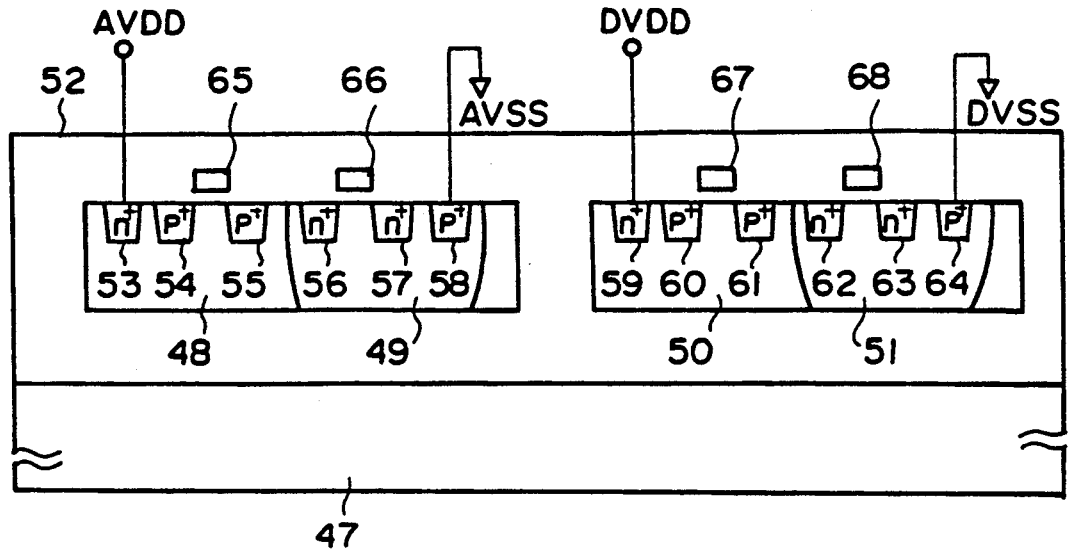
FIG. 1 is a cross-sectional view of a CMOS integrated circuit using an SOI arrangement.
Figure 2:
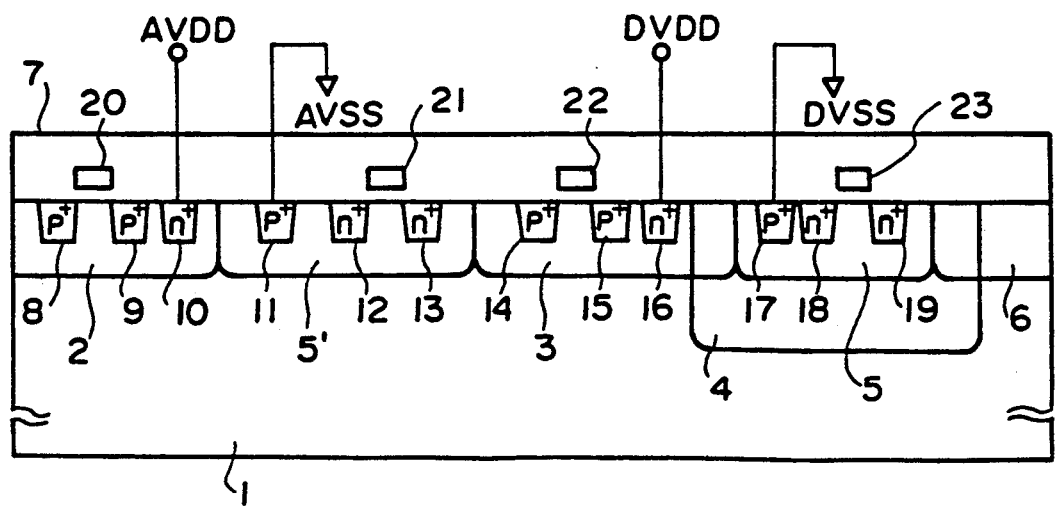
FIG. 2 is a cross-sectional view of a first embodiment of the CMOS integrated circuit according to the present invention.

FIG. 2 illustrates a cross-sectional view of a first embodiment of the CMOS integrated circuit according to the present invention, in which 1 denotes a p-substrate, 2, 3, 6 an n-well, 4 a deep n-well, 5, 5' a p-well, 7 $SiO_2$, 8, 9, 14, 15 a source/drain area constituting a p-channel transistor, 10, 16 a contact of the n-well, 11, 17 a contact of the p-well, 12, 13, 18, 19 each a source/drain area constituting an n-channel transistor, 20 through 23 a gate of each transistor, AVDD an analog positive power supply, AVSS an analog negative power supply, DVDD a digital positive power supply and DVSS a digital negative power supply.

The analog CMOS circuit includes the p-channel transistor formed by the source/drain areas 8, 9 and the gate 20 and the n-channel transistor formed by the source/drain areas 12, 13 and the gate 21. Further, the digital CMOS circuit includes the p-channel transistor formed by the source/drain areas 14, 15 and the gate 22 and the n-channel transistor formed by the source/drain areas 18, 19 and the gate 23. Incidentally, the p-well 5' may be arranged with the p-substrate per se without taking the form of the well.

As illustrated in FIG. 2, the potential of the n-well 2 where the analog p-channel transistor is formed is given by the analog positive power supply AVDD, the potential of the p-well 5' where the analog n-channel transistor is formed is given by the analog negative power supply AVSS, the potential of the n-well 3 where the digital p-channel transistor is formed is given by the digital positive power supply DVDD and the potential of the p-well 5 where the digital n-channel transistor is formed is given by the digital negative power supply DVSS. In consequence, the potential of the p-substrate 1 becomes equal to that of the p-well 5' for the analog circuit and the potential of the deep n-well 4 becomes equal to that of the n-well 3 for the digital circuit. Therefore, a depletion layer is formed by the reverse bias applied to the pn junction between the adjacent p-well and the n-well, p-substrate and the n-well, p-well and the deep n-well and the deep n-well and the p-well therein respectively.

Figure 3:
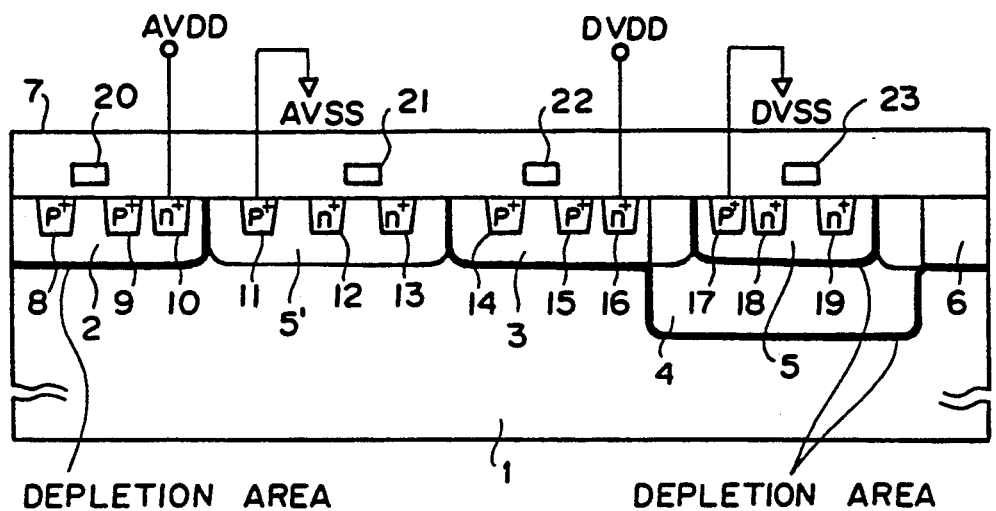
FIG. 3 is a cross-sectional view illustrating an area of the CMOS integrated circuit of the present invention where the depletion layer is formed.

In FIG. 3, the area where this depletion area is formed is indicated by a thick line. As seen from this FIG. 3, the area where the digital circuit is formed, that is, the n-well 3 and the p-well 5 can be separated from the p-substrate 1 by the depletion layer.

The processing of manufacturing the foregoing CMOS integrated circuit can be realized by merely adding the process of forming the deep n-well 4 to the process of manufacturing the normal CMOS integrated circuit. This process of forming the deep n-well 4 may be carried out prior to the process of forming the n- and p-wells 3, 5, or prior to the process of forming the p-well 5 after the process of forming the n-well 3, or after the process of forming the n- and p-wells 3, 5.

Figure 4:
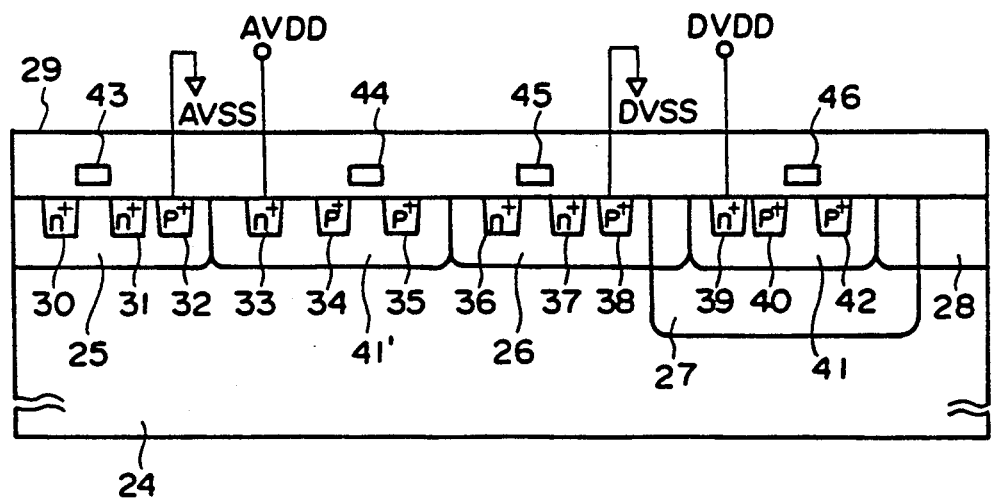
FIG. 4 is a cross-sectional view of a second embodiment of the CMOS integrated circuit according to the present invention.

FIG. 4 illustrates a cross-sectional view of a second embodiment of the CMOS integrated circuit according to the present invention. The foregoing first embodiment uses the p-substrate while this embodiment uses the n-substrate.

In FIG. 4, 24 denotes an n-substrate, 25, 26, 28 a p-well respectively, 27 a deep p-well, 41, 41' an n-well respectively, 29 $SiO_2$, 30, 31, 36, 37 a source/drain area constituting the n-channel transistor, 32, 38 a contact of the p-well, 33, 39 a contact of the n-well, 34, 35, 40, 42 a source/drain area constituting the p-channel transistor, 43 through 46 a gate of each transistor, AVDD an analog positive power supply, AVSS an analog negative power supply, DVDD a digital positive power supply, DVSS a digital negative power supply.

The analog CMOS circuit includes the n-channel transistor formed by the source/drain areas 30, 31 and the gate 43 and the p-channel transistor formed by the source/drain areas 34, 35 and the gate 44. Further, the digital CMOS circuit includes the n-channel transistor formed by the source/drain areas 36, 37 and the gate 45 and the p-channel transistor formed by the source/drain areas 40, 42 and the gate 46. Incidentally, the n-well 41' may be arranged with the n-substrate per se without specifically taking the form of the well arrangement.

Also in this embodiment, by applying a voltage of predetermined polarity to each well by each illustrated power supply, a depletion layer caused by the reverse bias applied to the pn junction is formed between the adjacent p- and n-wells, n-substrate and the p-well, n-substrate and the deep p-well and the deep p-well and the n-well therein, as in the first embodiment, so that the area forming the digital circuit, that is, the p- and n-wells 26, 41 can be separated from the n-substrate 24 by the depletion layer.

The process of manufacturing the foregoing CMOS integrated circuit can be realized, as in the first embodiment, by only adding the process of forming the deep p-well 27 to the process of manufacturing the normal CMOS integrated circuit.

The present invention is not necessarily restricted to the foregoing embodiments, but various changes and modifications may be made to it within the scope of the present invention.

What is claimed is:

1. A CMOS integrated circuit on which an analog CMOS circuit and a digital CMOS circuit appear, said CMOS integrated circuit comprising:

a first p-type well and second n-type well which are each formed on a p-type substrate;

a third n-type well having a greater depth than said first and second wells, said second and third wells partially overlapping each other, said first well being surrounded by a region comprised of said second and third wells;

a first and second digital series power supplies each connected to said first and second wells, respectively, for imparting low and high potentials, respectively;

a fourth p-type well and fifth n-type well which are each formed on said substrate, remote from said third well;

a first and second analog series power supplies each connected to said fourth and fifth wells, respectively, for imparting low and high potentials, respectively;

a first n-channel MOS transistor being part of said digital CMOS circuit, said first n-channel MOS transistor being formed on the surface of said first well;

a first p-channel MOS transistor being part of said digital CMOS circuit, said first p-channel MOS transistor being formed on the surface of said second well;

a second n-channel MOS transistor being part of said analog CMOS circuit, said second n-channel MOS transistor being formed on the surface of said fourth well; and a second p-channel MOS transistor being part of said analog CMOS circuit, said second p-channel MOS transistor being formed on the surface of said fifth well.

2. A CMOS integrated circuit as set forth in claim 1 wherein a part of said substrate functions as said fourth well.

3. A CMOS integrated circuit on which an analog CMOS circuit and a digital CMOS circuit are loaded, comprising:

a first n-type well and second p-type well which are each formed on an n-type substrate;

a third p-type well having a greater depth than said first and second wells, said second and third wells partially overlapping each other, said first well being surrounded by a region comprised of said second and third wells;

a first and second digital series power supplies each connected to said first and second wells, respectively, for imparting high and low potentials, respectively;

a fourth n-type well and fifth p-type well which are each formed on said substrate, remote from said third well;

a first and second analog series power supplies each connected to said fourth and fifth wells, respectively, for imparting high and low potentials, respectively;

a first p-channel MOS transistor being part of said digital CMOS circuit, said first p-channel MOS transistor being formed on the surface of said first well;

a first n-channel MOS transistor being part of said digital CMOS circuit, said first n-channel MOS transistor being formed on the surface of said second well;

a second p-channel MOS transistor being part of said analog CMOS circuit, said second p-channel MOS transistor being formed on the surface of said fourth well; and a second n-channel MOS transistor being part of said analog CMOS circuit, said second n-channel MOS transistor being formed on the surface of said fifth well.

4. CMOS integrated circuit as set forth in claim 3 wherein a part of said substrate functions as said fourth well.

* * * * *